(12) United States Patent
Huang et al.

(10) Patent No.: US 9,833,973 B2
(45) Date of Patent: Dec. 5, 2017

(54) METAL LAMINATE WITH POLYIMIDE RESIN AND METHOD FOR MANUFACTURING THE SAME

(71) Applicant: Microcosm Technology CO, LTD., Tainan (TW)

(72) Inventors: Tang-Chieh Huang, Tainan (TW); Sih-Ci Jheng, Tainan (TW); Chin-Te Yen, Tainan (TW)

(73) Assignee: Microcosm Technology Co, Ltd., Tainan (TW)

( * ) Notice: Subject to any disclaimer, the term of this patent is extended or adjusted under 35 U.S.C. 154(b) by 196 days.

(21) Appl. No.: 14/954,724

(22) Filed: Nov. 30, 2015

(65) Prior Publication Data

US 2017/0008254 A1    Jan. 12, 2017

(30) Foreign Application Priority Data

Jul. 7, 2015 (TW) .............................. 104121997 A

(51) Int. Cl.

| | | |
|---|---|---|
| B32B 15/04 | (2006.01) | |
| B32B 7/12 | (2006.01) | |
| B32B 37/06 | (2006.01) | |
| B32B 37/24 | (2006.01) | |
| B32B 38/00 | (2006.01) | |
| H05K 1/03 | (2006.01) | |
| H05K 3/00 | (2006.01) | |
| H05K 3/30 | (2006.01) | |
| H05K 1/02 | (2006.01) | |
| H01B 3/30 | (2006.01) | |
| B32B 37/02 | (2006.01) | |
| B32B 7/04 | (2006.01) | |
| B32B 15/08 | (2006.01) | |
| B32B 27/28 | (2006.01) | |
| C08J 5/12 | (2006.01) | |
| H05K 3/02 | (2006.01) | |
| B32B 37/00 | (2006.01) | |

(52) U.S. Cl.
CPC .............. *B32B 15/043* (2013.01); *B32B 7/04* (2013.01); *B32B 7/12* (2013.01); *B32B 15/08* (2013.01); *B32B 27/281* (2013.01); *B32B 37/02* (2013.01); *B32B 37/06* (2013.01); *B32B 37/24* (2013.01); *H01B 3/306* (2013.01); *H05K 1/0346* (2013.01); *B32B 2037/0092* (2013.01); *B32B 2037/243* (2013.01); *B32B 2255/06* (2013.01); *B32B 2255/26* (2013.01); *B32B 2307/202* (2013.01); *B32B 2307/206* (2013.01); *B32B 2307/306* (2013.01); *B32B 2307/412* (2013.01); *B32B 2307/414* (2013.01); *B32B 2307/50* (2013.01); *B32B 2307/704* (2013.01); *B32B 2307/732* (2013.01); *B32B 2307/734* (2013.01); *B32B 2311/00* (2013.01); *B32B 2311/12* (2013.01); *B32B 2379/08* (2013.01); *B32B 2457/00* (2013.01); *B32B 2457/08* (2013.01); *C08J 2379/08* (2013.01); *H05K 1/024* (2013.01); *H05K 3/022* (2013.01); *H05K 2201/0154* (2013.01)

(58) Field of Classification Search
CPC ............ B32B 15/043; B32B 2307/206; H05K 1/0346; H01B 3/306
USPC ............................... 428/458, 473.5; 156/242
See application file for complete search history.

(56) References Cited

U.S. PATENT DOCUMENTS

2009/0142607 A1* 6/2009 Narui .................. B29C 47/0021
                                                                428/458
2014/0085830 A1* 3/2014 Fukuda ................. H01L 51/529
                                                                361/720

FOREIGN PATENT DOCUMENTS

| JP | 2006005058 | 1/2006 |
|---|---|---|
| JP | 2006216888 | 8/2006 |
| JP | 2010513592 | 4/2010 |
| JP | 2013229505 | 11/2013 |

* cited by examiner

*Primary Examiner* — Fred M Teskin
(74) *Attorney, Agent, or Firm* — Haverstock & Owens LLP

(57) ABSTRACT

A metal laminate comprising a metal layer and an insulating layer is provided. The insulating layer is disposed on the metal layer and directly contacts the metal layer. The insulating layer is made of a polyimide resin, and the polyimide resin is derived from at least two dianhydrides and at least two diamines. The dianhydride monomers are selected from the group consisting of p-phenylenebis (trimellitate anhydride), 4,4'-(hexafluoroisopropylidene)-diphthalic anhydride, 4,4'-(4,4'-isopropylidenediphenoxy)bis(phthalic anhydride) and the combination thereof. One of the diamine monomers is 2,2'-bis(trifluoromethyl)benzidine, and the other diamine monomers are selected from the group consisting of 2,2-bis[4-(4-aminophenoxy)phenyl, 1,3-bis(4-aminophenoxy)benzene, p-phenylenediamine, 4,4'-oxydianiline, 4,4'-methylenedianiline, 4,4'-diaminobenzanilide, 4,4'-diaminodiphenyl-sulfone, m-tolidine, 2,2-bis[4-(4-aminophenoxy)phenyl]hexafluoropropane and the combination thereof. A molar ratio of the dianhydride monomers to the diamine monomers is between 0.85 and 1.15.

12 Claims, 11 Drawing Sheets

1

2

METAL LAMINATE WITH POLYIMIDE RESIN AND METHOD FOR MANUFACTURING THE SAME

BACKGROUND

Technical Field

The present invention is related to a metal laminate, in particular to adhesive-free metal laminate whose insulating layer is made of polyimide resin.

Description of Related Art

Flexible printed circuit board (FPCB) has been widely used in high-density portable electronic devices due to its flexible features. Traditional polyimide (PI) FPCBs use a thermosetting polyimide resin as insulating layer. An adhesive (such as epoxy) is coating on one side of thermosetting polyimide resin to bond with metal layer (such as copper foil). The product is called single-side metal laminate. If the laminate needs to support more circuits, the adhesive could be coated on both side of the thermosetting polyimide resin to bond metal layer. The product is called double-side metal laminate. However, the adhesive may decrease the flexibility, solder resistance, dimensional stability and limit the thickness of the metal laminate. Also, the adhesive may cause environmental problem.

SUMMARY

In view of the above problems, the present invention provides a metal laminate and a method for manufacturing the same. The metal laminate of present invention uses specific polyimide resin as its insulating layer, and the insulating layer (polyimide resin) directly contacts the metal layer without adhesive. The metal laminate of the present invention is characterized by a low dielectric constant and a low dissipation factor, thus is suitable for high frequency electronic devices.

According to one aspect of the present invention, a metal laminate is provided. The metal laminate comprises a first metal layer and an insulating layer. The insulating layer is made of a polyimide resin, disposed on the metal layer and directly contacts the metal layer. The polyimide resin is derived from at least two dianhydride monomers and at least two diamine monomers. The dianhydride monomers are selected from the group consisting of p-phenylenebis(trimellitate anhydride), 4,4'-(hexafluoroisopropylidene)-diphthalic anhydride, 4,4'-(4,4'-isopropylidenediphenoxy)bis(phthalic anhydride) and the combination thereof. One of the diamine monomers is 2,2'-bis(trifluoromethyl)benzidine, and the other diamine monomers are selected from a group consisting of 2,2-bis[4-(4-aminophenoxy)phenyl, 1,3-bis(4-aminophenoxy)benzene, p-phenylenediamine, 4,4'-oxydianiline, 4,4'-methylenedianiline, 4,4'-diaminobenzanilide, 4,4'-diaminodiphenyl-sulfone, m-tolidine, 2,2-bis[4-(4-aminophenoxy)phenyl]hexafluoropropane and the combination thereof. A molar ratio of the dianhydride monomers to the diamine monomers is between 0.85 and 1.15.

According to another aspect of present invention, a method for manufacturing a metal laminate is provided. The method comprises the following steps: providing a first metal layer; coating a precursor of a polyimide resin on the first metal layer, wherein the precursor of the polyimide resin is polymerized by at least two dianhydride monomers and at least two diamine monomers. The dianhydride monomers are selected from the group consisting of p-phenylenebis(trimellitate anhydride), 4,4'-(hexafluoroisopropylidene)-diphthalic anhydride, 4,4'-(4,4'-isopropylidenediphenoxy)bis(phthalic anhydride) and the combination thereof. One of the diamine monomers is 2,2'-bis(trifluoromethyl)benzidine, and the other diamine monomers are selected from a group consisting of 2,2-bis[4-(4-aminophenoxy)phenyl, 1,3-bis(4-aminophenoxy)benzene, p-phenylenediamine, 4,4'-oxydianiline, 4,4'-methylenedianiline, 4,4'-diaminobenzanilide, 4,4'-diaminodiphenyl-sulfone, m-tolidine, 2,2-bis[4-(4-aminophenoxy)phenyl]hexafluoropropane and the combination thereof. A molar ratio of the dianhydride monomers to the diamine monomers is between 0.85 and 1.15; and imidizing the precursor of the polyimide resin to form a first polyimide layer.

According to another aspect of the present invention, a method for manufacturing a metal laminate is provided. The method comprises providing a polyimide film made of the polyimide resin by foregoing step; disposing a first metal layer on one side of the polyimide film and a second metal layer on the other side of the polyimide film; and bonding the first and the second metal layer and the polyimide film by thermocompression.

Many of the attendant features and advantages of the present invention will be better understood with reference to the following detailed description considered in connection with the accompanying drawings.

DETAILED DESCRIPTION

Figure 1A:
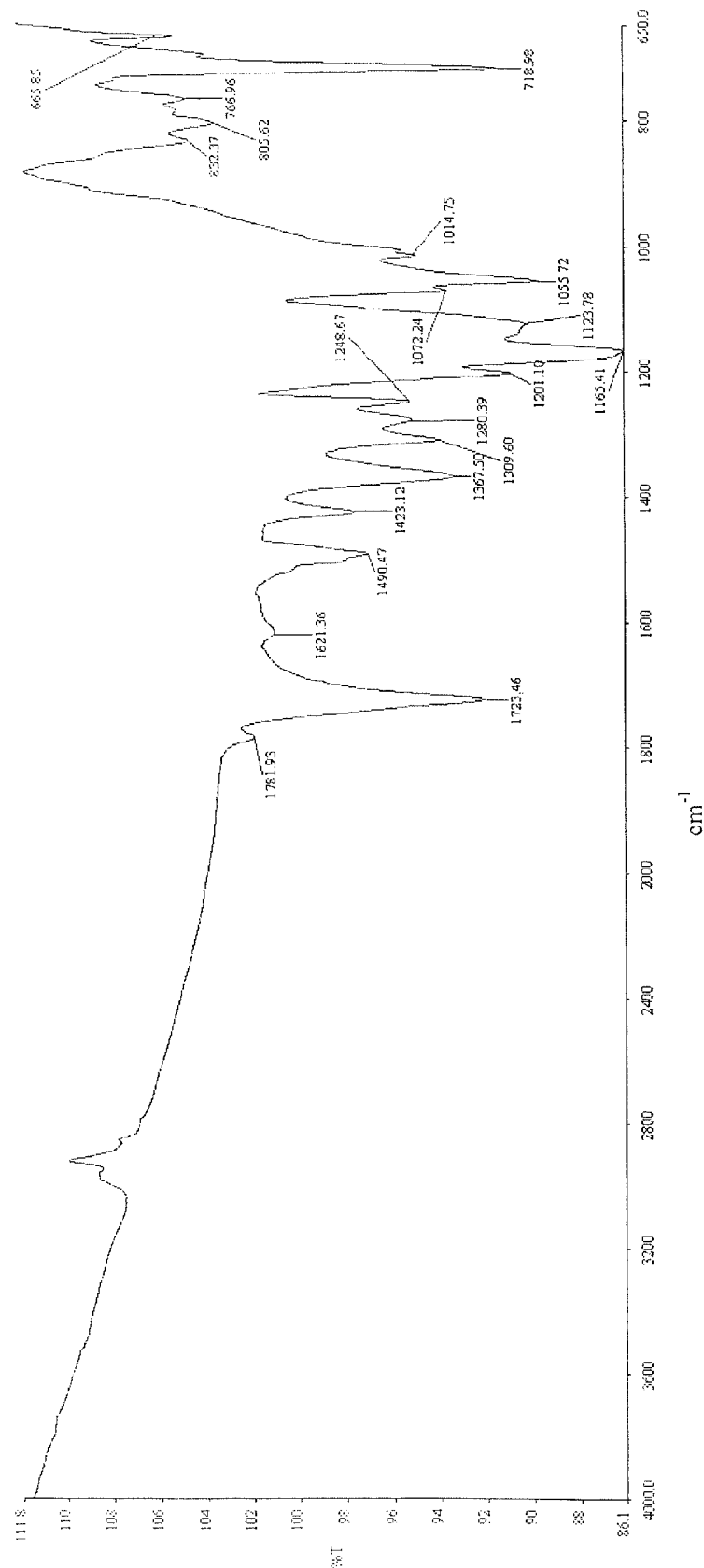
FIG. 1A shows an IR spectrum of polyimide resin according to Example 1.
Figure 1B:
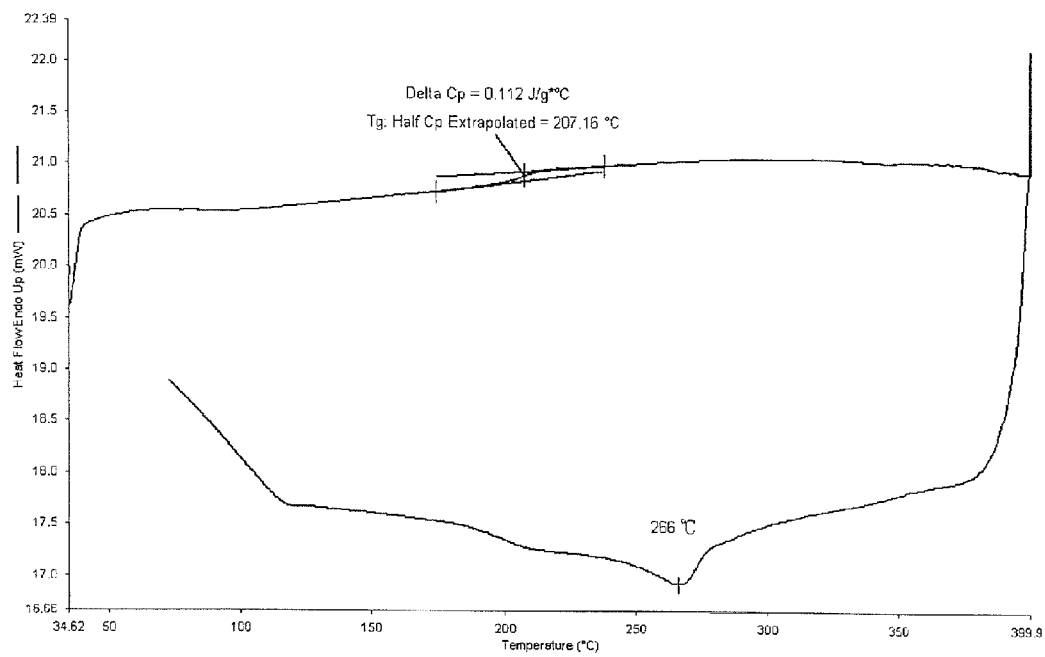
FIG. 1B shows a DSC (Differential scanning calorimetry) spectrum of polyimide resin according to Example 1.
Figure 2A:
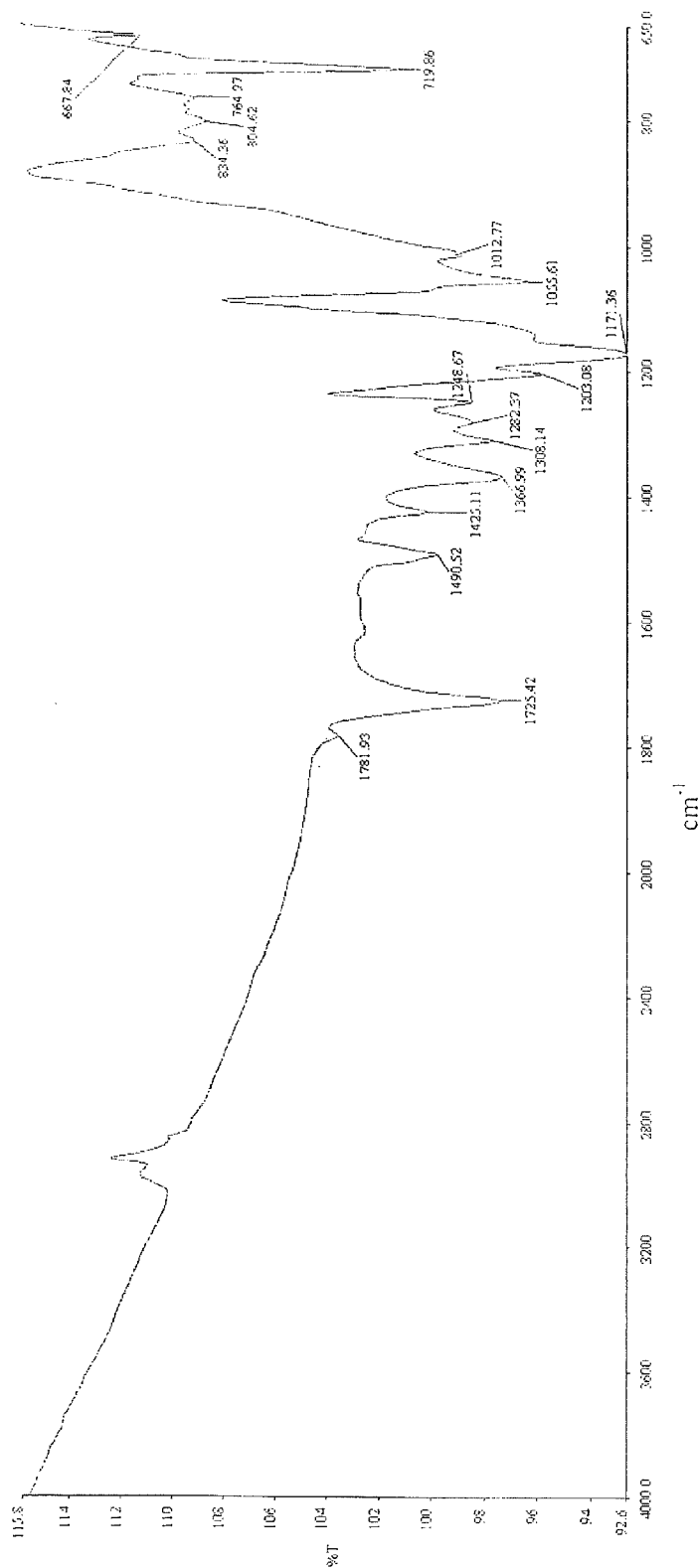
FIG. 2A shows an IR spectrum of Polyimide resin according to Example 2.
Figure 2B:
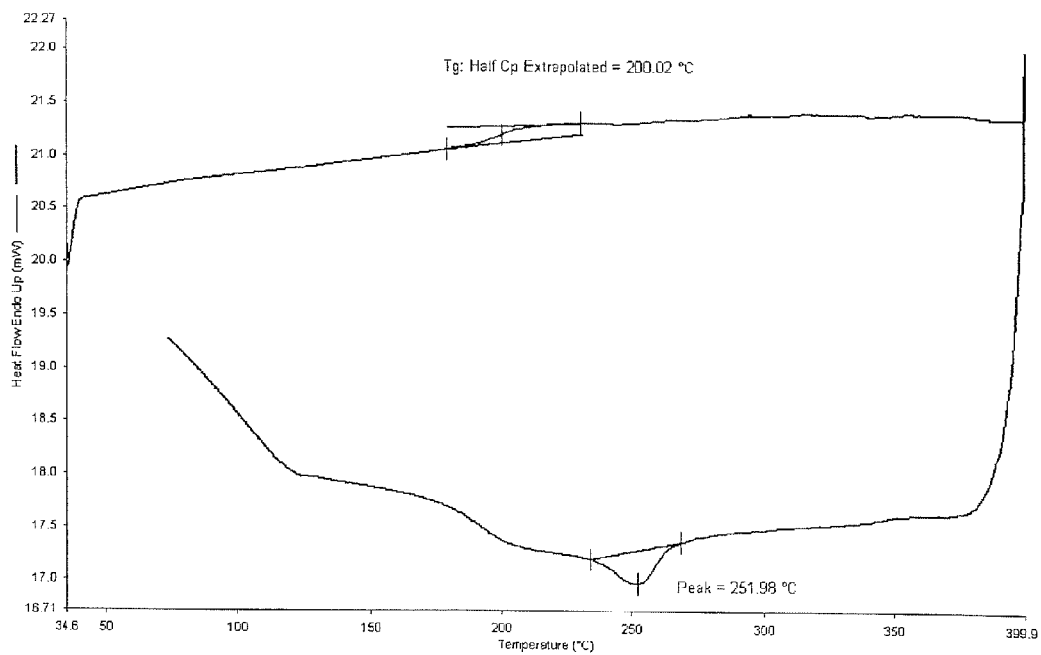
FIG. 2B shows a DSC (Differential scanning calorimetry) spectrum of polyimide resin according to Example 2.
Figure 3A:
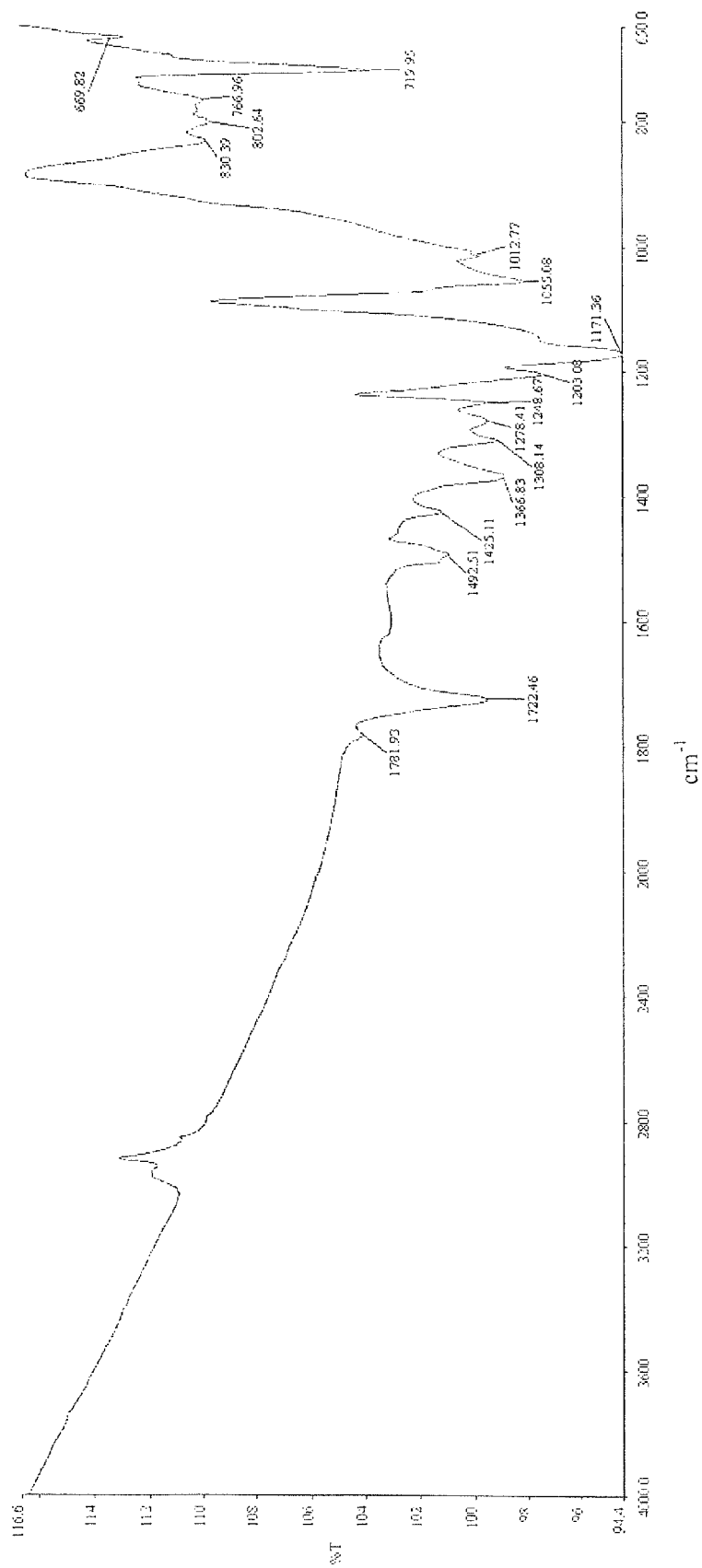
FIG. 3A shows an IR spectrum of polyimide resin according to Example 3.
Figure 3B:
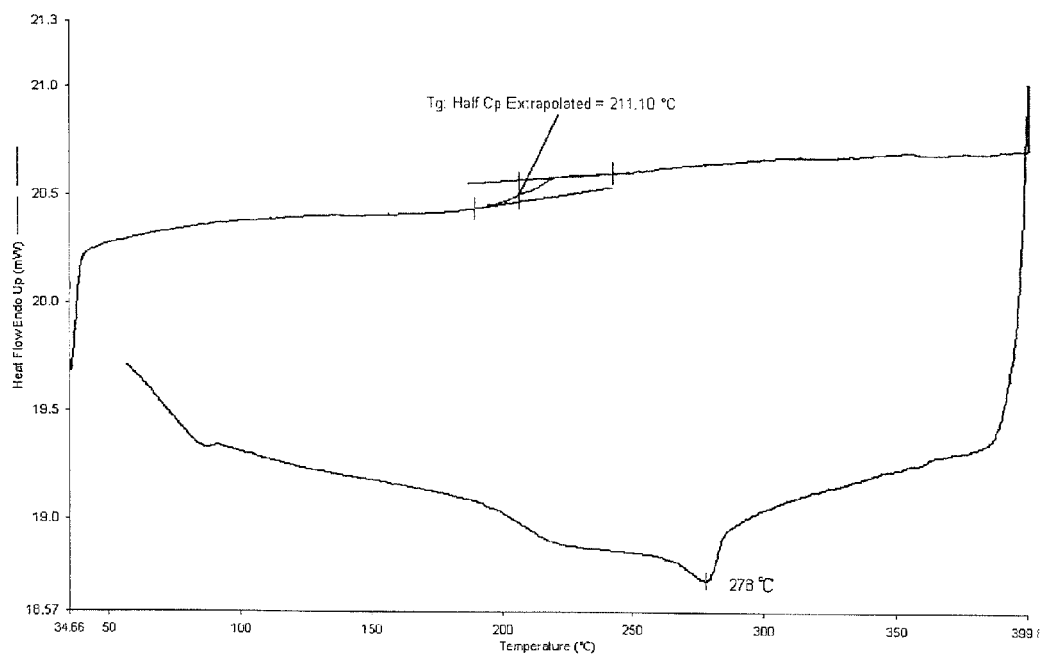
FIG. 3B shows a DSC (Differential scanning calorimetry) spectrum of polyimide resin according to Example 3.
Figure 4A:
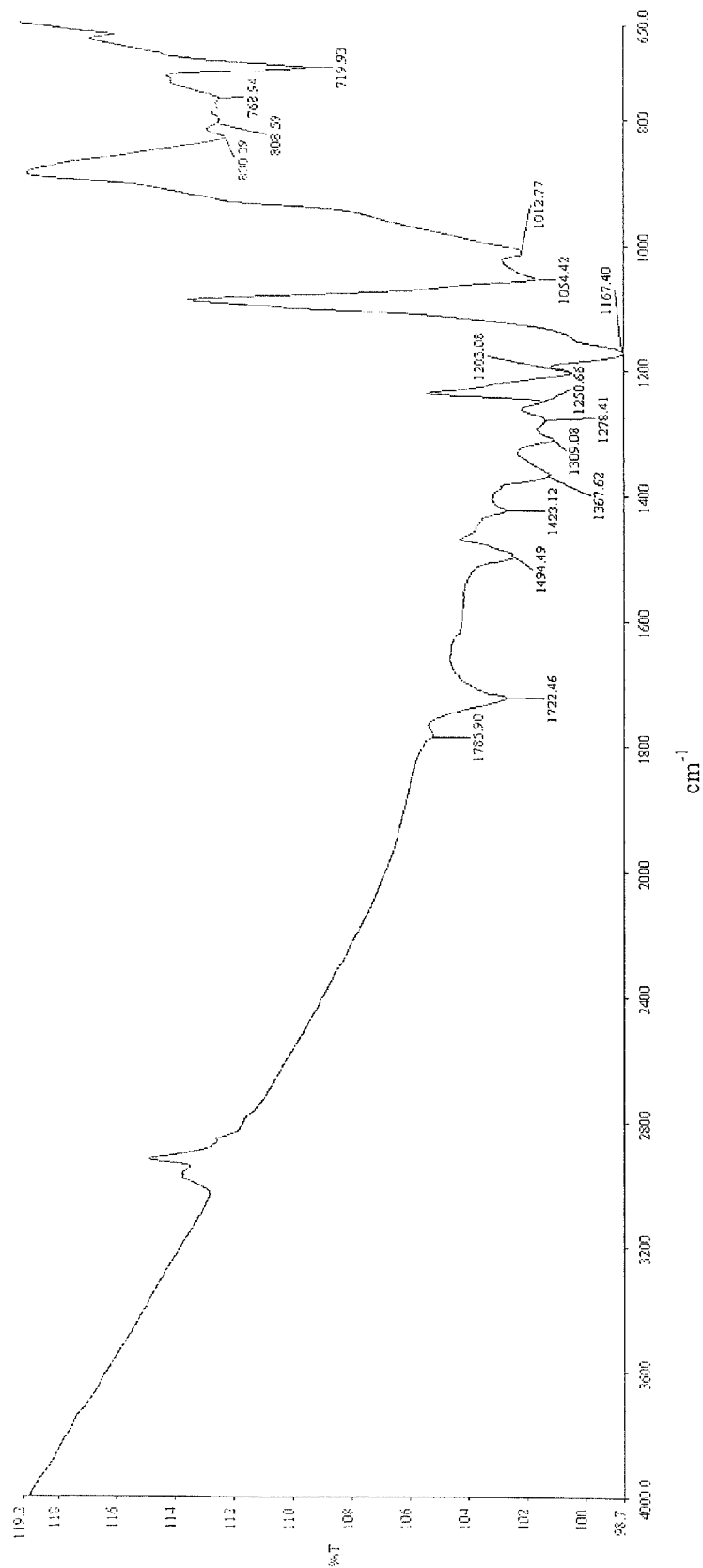
FIG. 4A shows an IR spectrum of polyimide resin according to Example 4.
Figure 4B:
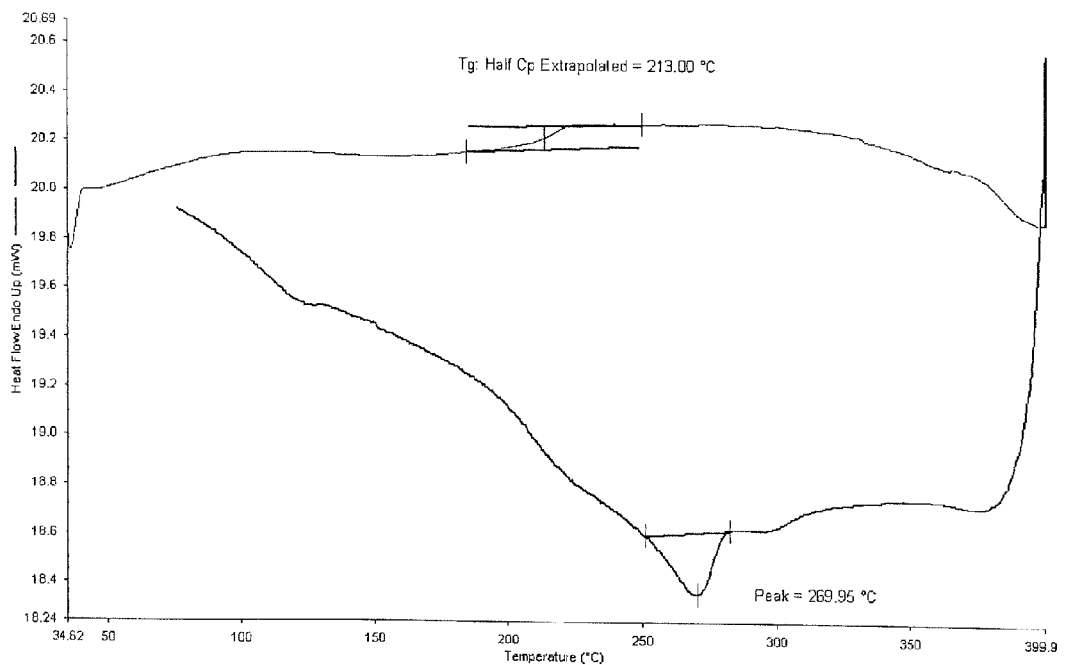
FIG. 4B shows a DSC (Differential scanning calorimetry) spectrum of polyimide resin according to Example 4.
Figure 5A:
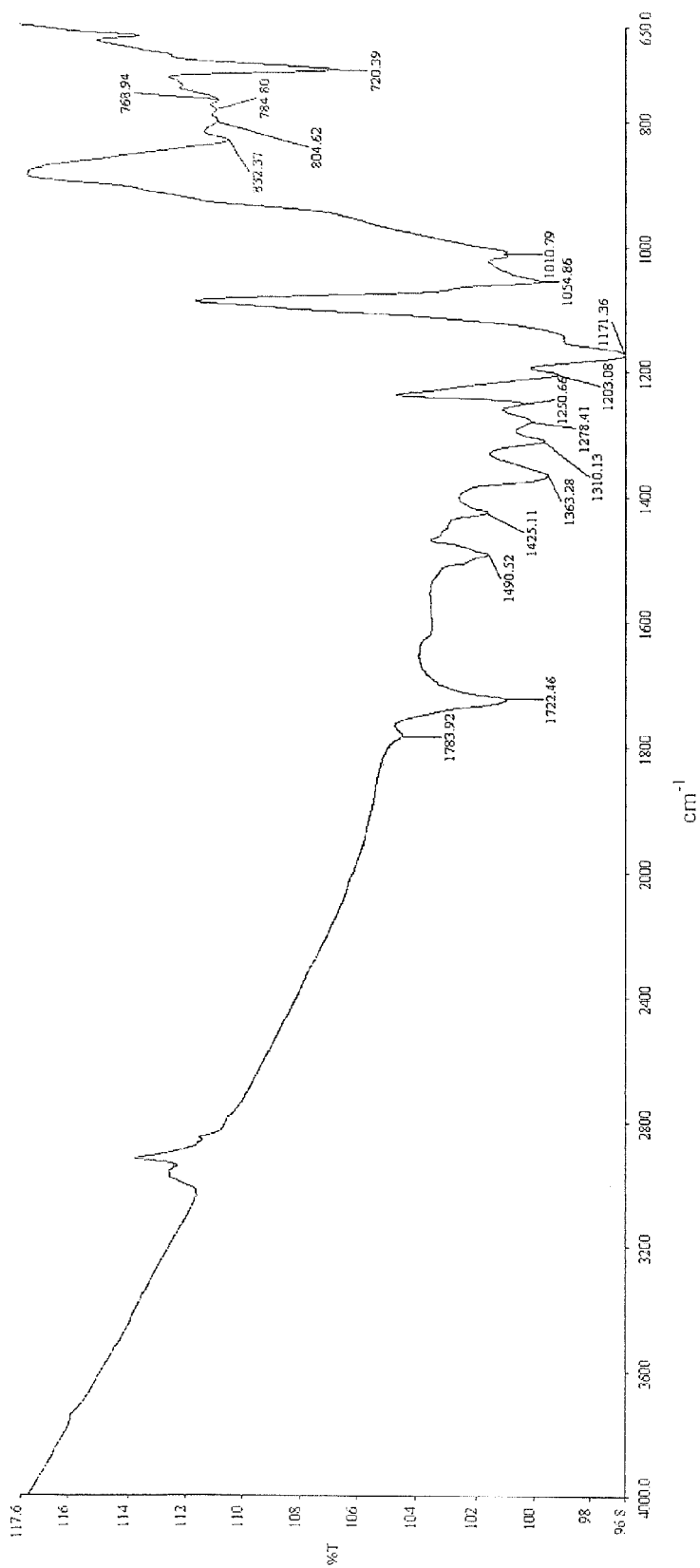
FIG. 5A shows an IR spectrum of polyimide resin according to Example 5.
Figure 5B:
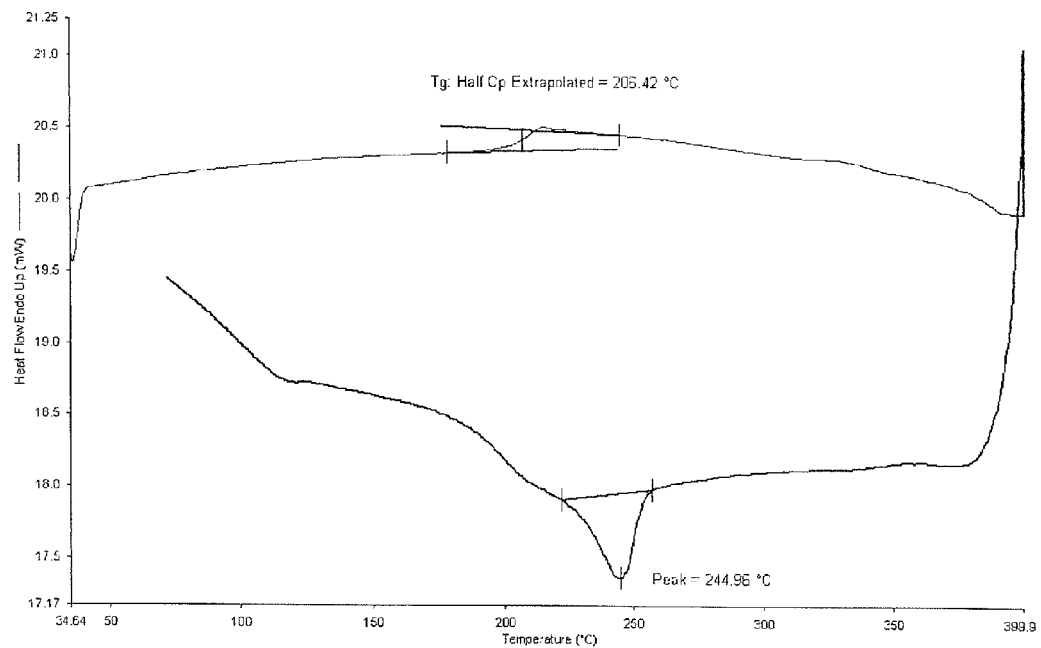
FIG. 5B shows a DSC (Differential scanning calorimetry) spectrum of polyimide resin according to Example 5.

The metal laminate of the present invention uses a specific polyimide resin as its insulating layer. The synthesis of said polyimide resin was carried out in a polymerization reaction with dianhydride monomer and diamine monomer first. The polymerization reaction formed polyamic acid (the precursor of the polyimide resin). Next, the polyimide resin was produced by an imidization reaction of the polyamic acid.

The polymerization reaction could be carried out by dissolving dianhydride monomer and diamine monomer in a solvent, mixing the dissolved dianhydride monomer and the dissolved diamine monomer, and then obtaining polyamic acid (the precursor of the polyimide resin).

The solvent suitable for the present invention can be an aprotic solvent, such as N,N-dimethylacetamide, N,N-diethylacetamide, N,N-dimethylformamide or N-methyl-2-pyrrolidone, but is not limited thereto. Other suitable aprotic solvents can also be used in the polymerization reaction.

In one embodiment, the dianhydride monomers and the diamine monomers are in an amount of from 5 to 40 weight percent, based on a total weight of the dianhydride monomers, the diamine monomers and the solvent.

The imidization reaction (imidizing step) could be carried out in thermal condition. For example, heating the polyamic acid (the precursor of the polyimide resin) continuously or at intervals could trigger the imidization reaction. The polyimide resin thin film or insulating layer can be formed by coating the polyamic acid (the precursor of the polyimide resin) on a substrate, and then heating the whole substrate in an oven. Besides, the imidization reaction could be carried out with other known methods, and the present invention is not limited thereto.

The dianhydride monomer used for synthesizing the polyimide resin of the present invention is an aromatic dianhydride monomer. Preferably, the molecular weight of the dianhydride monomer is between 400 and 600. Aromatic dianhydride monomers with low molecular weights (about 200-350, such as PMDA, BPDA and BTDA) will increase the density of the polar aldimine group in the polyimide resin. The polyimide resin derived by aromatic dianhydride monomers with low molecular weights has a high dielectric constant.

The aromatic dianhydride monomer used in the present invention may comprise the following compounds:

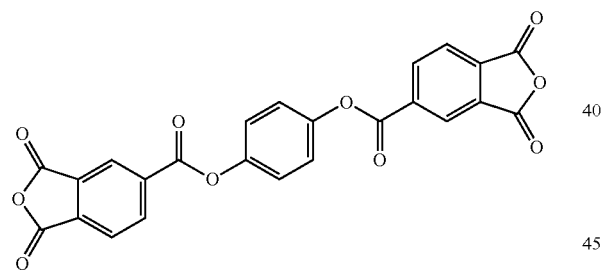

TAHQ: p-phenylenebis(trimellitate anhydride)

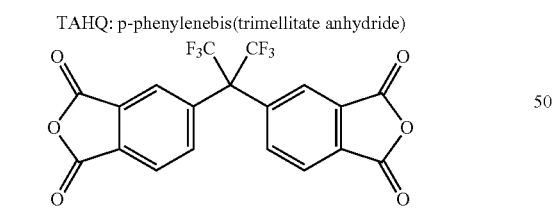

6FDA: 4,4'-(hexafluoroisopropylidine)diphthalic anhydride

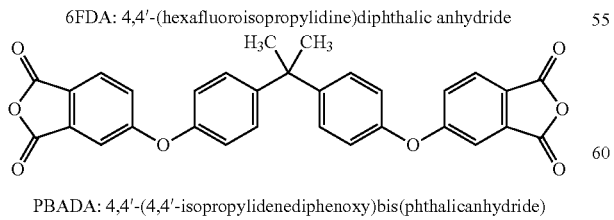

PBADA: 4,4'-(4,4'-isopropylidenediphenoxy)bis(phthalicanhydride)

The diamine monomer used for synthesizing the polyimide resin of the present invention is an aromatic diamine, which may comprise the following compounds:

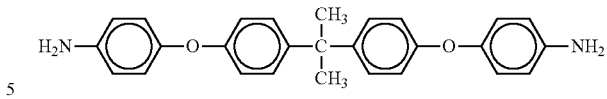

BAPP: 2,2-bis[4-(4-aminophenoxy)phenyl]propane

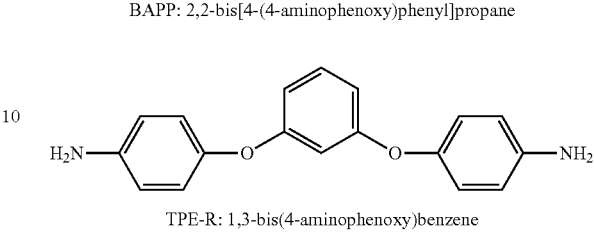

TPE-R: 1,3-bis(4-aminophenoxy)benzene

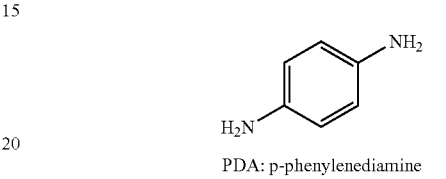

PDA: p-phenylenediamine

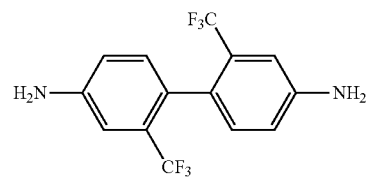

TFMB: 2,2'-bis(trifluoromethyl)benzidine

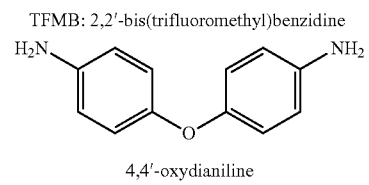

4,4'-oxydianiline

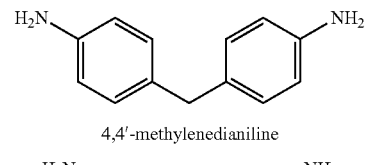

4,4'-methylenedianiline

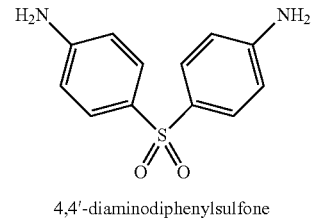

4,4'-diaminodiphenylsulfone

4,4'-diaminobenzanilide

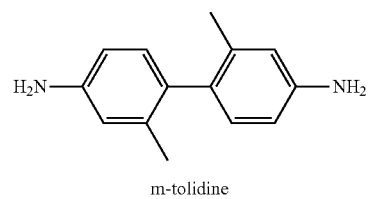

m-tolidine

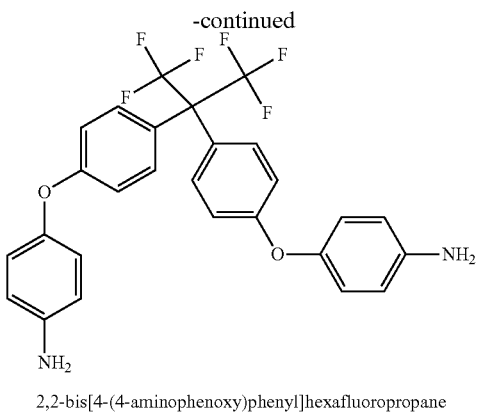

2,2-bis[4-(4-aminophenoxy)phenyl]hexafluoropropane

It is to be noted that the polyimide resin of the present invention is synthesized by two or more dianhydride monomers and two or more diamine monomers.

In the polyimide resin of the present invention, the molar ratio of dianhydride monomers to diamine monomers is between 0.85 and 1.15.

In one embodiment of the present invention, if the dianhydride monomer comprises p-phenylenebis(trimellitate anhydride), p-phenylenebis has an amount of moles accounting for 80 to 95% of total moles of the dianhydride monomers.

In one embodiment, if the dianhydride monomers comprise 4,4'-(hexafluoroisopropylidene)-diphthalic anhydride, 4,4'-(hexafluoroisopropylidene)-diphthalic anhydride has an amount of moles accounting for at most 15% of total moles of the dianhydride monomers.

In one embodiment, if the dianhydride monomers comprise 4,4'-(4,4'-isopropylidenediphenoxy)bis(phthalic anhydride), 4,4'-(4,4'-isopropylidenediphenoxy)bis(phthalic anhydride) has an amount of moles accounting for at most 15% of total moles of the dianhydride monomers.

In one embodiment, if the diamine monomers comprise 2,2'-bis(trifluoromethyl)benzidine, 2,2'-bis(trifluoromethyl) benzidine has an amount of moles accounting for 70 to 90% of total moles of the diamine monomers.

The polyimide resin described above is produced by mixing two or more dianhydride monomers and two or more diamine monomers at a specific ratio, and has a dielectric dissipation factor less than 0.007 and a coefficient of linear thermal expansion between 15 to 35 ppm/K.

Various examples will now be described to show the preparing methods of the polyamic acid (the precursor of the polyimide resin) of the present invention, and its physical or chemical property will be measured.

Preparation of the Polyamic Acid Solution (the Precursor of the Polyimide Resin)

Example 1

24.20 g (0.076 mole) of 2,2'-bis(trifluoromethyl)benzidine (TFMB), 1.85 g (0.017 mole) of p-phenylenediamine (PDA), 2.36 g (0.008 mole) of 1,3-bis(4-aminophenoxy) benzene (TPE-R) and 244.37 g of N-methyl-2-pyrrolidone (NMP) were added in a three-necked flask and stirred at 30° C. until completely dissolved. 41.75 g (0.091 mole) of p-phenylenebis(trimellitate anhydride) (TAHQ) and 2.83 g (0.005 mole) of 4,4'-(4,4'-isopropylidenediphenoxy)bis (phthalic anhydride) (PBADA) were then added and stirred at 25° C. for 24 hrs. The polymerization reaction was carried out to produce the polyamic acid solution of Example 1. In this example, the dianhydride and diamine monomers are in an amount of 23 weight percent of the total weight of the reaction solution [(24.20+1.85+2.36+41.75+2.83)/(24.20+1.85+2.36+41.75+2.83+244.37)×100%=23%].

Example 2

26.28 g (0.082 mole) of 2,2'-bis(trifluoromethyl)benzidine (TFMB), 3.74 g (0.009 mole) of 2,2-bis[4-(4-aminophenoxy)phenyl]propane (BAPP) and 215.78 g of N-methyl-2-pyrrolidone (NMP) were added in a three-necked flask and stirred at 30° C. until completely dissolved. 47.12 g (0.102 mole) of p-phenylenebis(trimellitate anhydride) (TAHQ) and 2.02 g (0.005 mole) of 4,4'-(hexafluoroisopropylidene)diphthalic anhydride (6FDA) were then added and stirred at 25° C. for 24 hrs. The polymerization reaction was carried out to produce the polyamic acid solution of Example 2. In this example, the dianhydride and diamine monomers are in an amount of 25 weight percent of the total weight of the reaction solution [(26.28+3.74+39.88+2.02)/(26.28+3.74+39.88+2.02+215.78)×100%=25%]

Example 3

29.13 g (0.091 mole) of 2,2'-bis(trifluoromethyl)benzidine (TFMB), 1.84 g (0.017 mole) of p-phenylenediamine (PDA), 1.66 g (0.006 mole) of 1,3-bis(4-aminophenoxy) benzene (TPE-R) and 271.31 g of N-methyl-2-pyrrolidone (NMP) were added in a three-necked flask and stirred at 30° C. until completely dissolved. 39.88 g (0.087 mole) of p-phenylenebis(trimellitate anhydride) (TAHQ) and 5.92 g (0.011 mole) of 4,4'-(4,4'-isopropylidenediphenoxy)bis (phthalic anhydride) (PBADA) were then added and stirred at 25° C. for 24 hrs. The polymerization reaction was carried out to produce the polyamic acid solution of Example 3. In this example, the dianhydride and diamine monomers are in an amount of 24 weight percent of the total weight of the reaction solution [(29.13+1.84+1.66+47.12+5.92)/(29.13+1.84+1.66+47.12+5.92+271.31)×100%=24%].

Example 4

23.56 g (0.074 mole) of 2,2'-bis(trifluoromethyl)benzidine (TFMB), 1.49 g (0.014 mole) of p-phenylenediamine (PDA), 1.89 g (0.005 mole) of 2,2-bis[4-(4-aminophenoxy) phenyl]propane (BAPP) and 260.06 g of N-methyl-2-pyrrolidone (NMP) were added in a three-necked flask and stirred at 30° C. until completely dissolved. 38.10 g (0.083 mole) of p-phenylenebis(trimellitate anhydride) (TAHQ) and 4.09 g (0.009 mole) of 4,4'-(hexafluoroisopropylidene) diphthalic anhydride (6FDA) were then added and stirred at 25° C. for 24 hrs. The polymerization reaction was carried out to produce the polyamic acid solution of Example 4. In this example, the dianhydride and diamine monomers are in an amount of 21 weight percent of the total weight of the reaction solution [(23.56+1.49+1.89+38.10+4.09)/(23.56+1.49+1.89+38.10+4.09+260.06)×100%=21%].

Example 5

25.00 g (0.078 mole) of 2,2'-bis(trifluoromethyl)benzidine (TFMB), 1.49 g (0.014 mole) of p-phenylenediamine (PDA) and 244.32 g of N-methyl-2-pyrrolidone (NMP) were added in a three-necked flask and stirred at 30° C. until completely dissolved. 35.94 g (0.078 mole) of p-phenylenebis(trimellitate anhydride) (TAHQ), 4.08 g (0.009 mole) of 4,4'-(hexafluoroisopropylidene)diphthalic anhydride (6FDA) and 2.39 g (0.005 mole) of 4,4'-(4,4'-isopropylidenediphenoxy)bis(phthalic anhydride) (PBADA) were then added and stirred at 25° C. for 24 hrs. The polymerization reaction was carried out to produce the polyamic acid solution of Example 5. In this example, the dianhydride and diamine monomers are in an amount of 22 weight percent of the total weight of the reaction solution [(25.00+1.49+35.94+4.08+2.39)/(25.00+1.49+35.94+4.08+2.39+244.32)×100%=22%].

Comparative Examples 1-3 of the polyamic acid will be described in the following paragraphs. The Comparative Examples merely used one dianhydride monomer and one diamine monomer to produce the polyamic acid (the precursor of the polyimide resin). In contrast with the Comparative Examples, the polyamic acid of Examples 1-5 was produced by two or more dianhydride monomers and two or more diamine monomers.

Comparative Example 1

31.25 g (0.098 mole) of 2,2'-bis(trifluoromethyl)benzidine (TFMB) and 227.16 g of N-methyl-2-pyrrolidone (NMP) were added in a three-necked flask and stirred at 30° C. until completely dissolved. 44.47 g (0.097 mole) of p-phenylenebis(trimellitate anhydride) (TAHQ) was then added and stirred at 25° C. for 24 hrs. The polymerization reaction was carried out to produce the polyamic acid solution of Comparative Example 1. In this comparative example, the dianhydride and diamine monomers are in an amount of 25 weight percent of the total weight of the reaction solution [(31.25+44.47)/(31.25+44.47+227.16)×100%=25%].

Comparative Example 2

13.78 g (0.127 mole) of p-phenylenediamine (PDA) and 250.58 g of N-methyl-2-pyrrolidone (NMP) were added in a three-necked flask and stirred at 30° C. until completely dissolved. 56.90 g (0.124 mole) of p-phenylenebis(trimellitate anhydride) (TAHQ) was then added and stirred at 25° C. for 24 hrs. The polymerization reaction was carried out to produce the polyamic acid solution of Comparative Example 2. In this comparative example, the dianhydride and diamine monomers are in an amount of 22 weight percent of the total weight of the reaction solution [(13.78+56.90)/(13.78+56.90+250.58)×100%=22%].

Comparative Example 3

25.75 g (0.088 mole) of 1,3-bis(4-aminophenoxy)benzene (TPE-R) and 260.28 g of N-methyl-2-pyrrolidone (NMP) were added in a three-necked flask and stirred at 30° C. until completely dissolved. 39.33 g (0.085 mole) of p-phenylenebis(trimellitate anhydride) (TAHQ) was then added and stirred at 25° C. for 24 hrs. The polymerization reaction was carried out to produce the polyamic acid solution of Comparative Example 3. In this comparative example, the dianhydride and diamine monomers are in an amount of 20 weight percent of the total weight of the reaction solution [(25.74+39.33)/(25.74+39.33+260.28)×100%=20%].

Property and Measurement of Polyimide Resin

The compositions of respective polyimide films derived from the polyamic acid solutions of various Examples and Comparative Examples are listed in Table 1. Thin films were formed from the polyamic acid solutions (the precursor of the polyimide resin) of Examples and Comparative Example by the imidization reaction. The IR spectrum, dielectric constant (Dk), dissipation factor (Df), coefficient of linear thermal expansion (CTE), glass transition temperature (Tg) and crystallization temperature (Tc) of these thin film were measured. FIGS. 1A, 2A, 3A, 4A and 5A show the IR spectrums of the polyimide films of Example 1-5, respectively; FIGS. 1B, 2B, 3B, 4B and 5B show the DSC (Differential Scanning calorimeter) spectrums of polyimide films of Example 1-5, respectively. The measured properties are listed in Table 2.

TABLE 1

Compositions of Polyimide Films

| | Dianhydride monomers | | | Diamine monomers | | | | Dianhydride + Diamine monomer (wt %) | Dianhydride + Diamine monomer (molar ratio) |
|---|---|---|---|---|---|---|---|---|---|
| | TAHQ (mole) | 6FDA (mole) | PBADA (mole) | TFMB (mole) | PDA (mole) | TPE-R (mole) | BAPP (mole) | | |
| Example 1 | 0.091 | | 0.005 | 0.076 | 0.017 | 0.008 | | 23 | 0.95 |
| Example 2 | 0.087 | 0.005 | | 0.082 | | | 0.009 | 25 | 1.01 |
| Example 3 | 0.102 | | 0.011 | 0.091 | 0.017 | 0.006 | | 24 | 0.99 |
| Example 4 | 0.083 | 0.009 | | 0.074 | 0.014 | | 0.005 | 21 | 0.99 |
| Example 5 | 0.078 | 0.009 | 0.005 | 0.078 | 0.014 | | | 22 | 1.00 |
| Comparative Example 1 | 0.097 | | | 0.098 | | | | 25 | 0.99 |
| Comparative Example 2 | 0.124 | | | | 0.127 | | | 22 | 0.98 |
| Comparative Example 3 | 0.085 | | | | | 0.088 | | 20 | 0.97 |

TABLE 2

Properties of Polyimide Films

| | Dk | Df | CTE | Tg | Tc |
|---|---|---|---|---|---|
| Example 1 | 3.18 | 0.005 | 27 | 207 | 266 |
| Example 2 | 3.08 | 0.004 | 29 | 200 | 252 |
| Example 3 | 3.14 | 0.005 | 31 | 211 | 278 |
| Example 4 | 3.11 | 0.005 | 32 | 213 | 270 |
| Example 5 | 3.20 | 0.006 | 28 | 206 | 245 |
| Comparative Example 1 | 3.17 | 0.011 | 28 | N/A | N/A |
| Comparative Example 2 | 3.30 | 0.015 | 15 | N/A | N/A |
| Comparative Example 3 | 3.09 | 0.007 | 56 | 233 | N/A |

Properties in Table 2 were measured from polyimide films derived from polyamic acid solutions. The methods of measurement are described as follows:

Dielectric Constant (Dk):

This property is measured by RF Impedance/Material Analyzer (Agilent HP4291) at 10 GHz with IPC-TM-650-2.5.5.9 test method.

Dissipation Factor (Df):

This property is measured by RF Impedance/Material Analyzer (Agilent HP4291) at 10 GHz with IPC-TM-650-2.5.5.9 test method.

Coefficient of (Linear) Thermal Expansion (CTE):

This property is measured by thermal mechanical analysis. The thin film is extended under condition of weight 3 g/thickness 20 μ and heating rate 10° C./min, and the CTE is the average of values calculated from 50 to 200° C. The material with a low CTE is hard to deform during the PCB baking process, so that the production system has a high yield rate.

Glass Transition Temperature (Tg) and Crystallization Temperature (Tc):

This property is measured by Differential Scanning calorimeter (SII Nano Technology DSC-6220). The polyimide resin underwent the following steps in $N_2$ atmosphere heating at 10° C./min and then cooling at 30° C./min; and heating again at rate of 10° C./min. Glass transition temperature was determined by the value measured in the first or second heating process. Crystallization temperature was determined by the exothermic peak value measured in first cooling process.

The requirements for a high-frequency circuit are the transmission speed and the signal quality. Electrical properties such as dielectric constant (Dk) and dissipation factor (Df) are main factors that affect these criteria. The reason could be explained by the following formula:

$$\alpha_d = 0.9106 \times \sqrt{\in_R} \times F_{GHz} \times \tan \delta$$

wherein $\alpha_d$: transmission loss
$\in_R$: dielectric constant (Dk)
$F_{GHz}$: frequency
$\tan \delta$: dissipation factor (Df)

The above formula shows that the Df is more relative to transmission loss than Dk: the lower the Df, the lower the transmission loss. Thus, the material with a lower Df is more suitable for high frequency PCBs.

Table 1 and Table 2 show that the dissipation factors (Df) and coefficients of thermal expansion (CTE) of Examples 1-5 of the present invention (use of two or more dianhydride and two or more diamine monomers) are lower than those of Comparative Examples (use of only one dianhydride and one diamine monomer). The reason is that the aromatic ester functional group of single dianhydride monomer (such as TAHQ) and the aldimine functional group form a huge plane resonance structure. The huge plane structure affects the arrangement of the polyamic acid solution (the precursor of the polyimide resin) and polyimide resin. Thus the polyimide resin derived from single dianhydride and diamine monomer has a random arrangement and a low crystallinity. In addition to TAHQ which serves as a main dianhydride monomer, another dianhydride monomer with a molecular weight between 400 to 600 is introduced to the polyimide resin of the present Examples. Introducing another dianhydride monomer to the polyimide resin not only helps maintain the amount of aldimine group to prevent the dielectric constant from increasing but also enhances the arrangement of aromatic polyester group to improve the crystallinity. Referring to the experimental results in Table 2, the polyimide films of Comparative Example 1-3 (without the use of additional dianhydride monomers such as 6FDA and PBADA) are non-crystalline transparent films. In contrast with Comparative Example 1-3, the polyimide films of Examples 1-5 (use of 6FDA and/or PBADA) are translucent films, and their Tg and Tc are different from those of Comparative Examples.

Besides, the Comparative Examples show how different diamine monomers would affect properties of the polyimide resin. Comparative Example 1 has a CTE similar to those of Examples, and has a higher Df than Examples. Comparative Example 2 (PDA diamine monomer) has a lower CTE but a higher Df than other Comparative Examples. Comparative Example 3 (TPE-R diamine monomer) has a lower Df than other Comparative Examples, but its Df is still higher than those of Examples 1-5. The reason is that the non-linear diamine monomer (such as TPE-R, BAPP) has a lower rotation barrier, lower Df changes but a higher CTE. In contrast, the linear diamine monomer (such as PDA, TFMB) has a higher Df but a lower CTE. The polyimide resin of the present invention mixes two or more diamine monomers (for example the linear and non-linear diamine monomers) to attain a balance between a low CTE and a low Df, thereby obtaining a polyimide resin suitable for high frequency PCBs.

Manufacture of Metal Laminates

The polyimide of the present invention is characterized by a low dissipation factor, a good dimensional stability, a high heat resistance, a high coefficient of thermal expansion, an enhanced mechanical strength and a high resistance insulation, and thus is suitable for serving as an insulating layer in metal laminates. Such metal laminates could be used as FPCBs in electronic devices.

Figure 6:
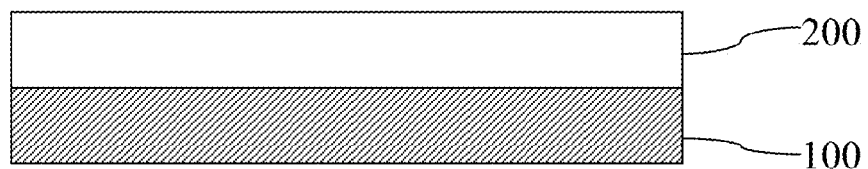
FIG. 6 shows a metal laminate according to one embodiment of present invention.

FIG. 6 shows a metal laminate 1 according to one embodiment of the present invention. The metal laminate 1 is a single-sided metal laminate comprising a first metal layer 100 and an insulating layer 200. The first metal 100 is a copper foil or a metal selected from other metals suitable for PCBs. The insulating layer 200 is made of the polyimide resin in the foregoing Example and has a low dissipation factor. The first metal layer 100 directly contacts the insulating layer 200, and there is no additional adhesive between the two layers.

The single-sided metal laminate 1 in FIG. 6 can be manufactured by the following steps: coating the foregoing polyamic acid solution (the precursor of the polyimide resin) on the first metal layer 100; imidizing the precursor (i.e. heating it in an oven) to form a polyimide insulating layer 200; and obtaining the metal laminate 1 in FIG. 6.

Figure 7:
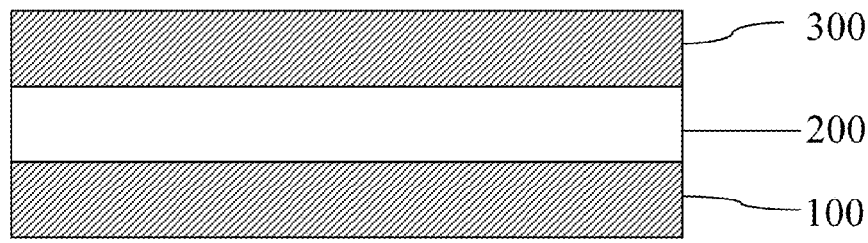
FIG. 7 shows a metal laminate according to another embodiment of present invention.

FIG. 7 shows a metal laminate 2 according to another embodiment of the present invention. The metal laminate 2 is a metal laminate with double sides. The difference between the double-sided metal laminate in FIG. 7 and the single-sided metal laminate in FIG. 6 is the number of metal layers. The double-sided metal laminate further comprises a second metal layer 300. The second metal layer 300, like the first metal layer 100, directly contacts the insulating layer 200. In other words, the insulating layer 200 bonds the first metal layer 100 and the second metal layer 300, and there is no additional adhesive between the layers.

The materials for the first metal layer 100 and the second metal layer 300 can be the same or different metal(s). The thickness of the insulating layer 200 can be controlled by adjusting the amount of polyamic acid solution (the precursor of the polyimide resin). In one embodiment, the thickness of the insulating layer is between 5 to 50 μm.

The double-sided metal laminate 2 in FIG. 7 can be manufactured by one of the following methods:

The manufacturing method (1) comprises the steps of: obtaining the single-sided metal laminate 1 in FIG. 6; providing a second metal layer 300 (FIG. 7) on the other side of the polyimide insulating layer 200; and bonding the second metal layer 300 and the polyimide insulating layer 200 by thermocompression so as to obtain the double-sided metal laminate 2 in FIG. 7.

The manufacturing method (2) comprises the steps of: coating the polyamic acid solution (the precursor of the polyimide resin) on the first metal layer 100 and the second metal layer 300 respectively; heating the polyamic acid solution to induce the imidization reaction and thereby to form polyimide insulating layers on the first metal layer and the second metal layer; and bonding the polyimide insulating layers on the first metal layer and the second metal layer by thermocompression so as to obtain the double-sided metal laminate 2.

The manufacturing method (3) comprises the steps of: coating the polyamic acid solution (the precursor of polyimide resin) on a detachable carrier; imidizing the precursor to form the polyimide resin; peeling the polyimide resin to obtain a polyimide film (like the insulating layer 200); disposing the first metal layer 100 and the second metal layer 300 on both sides of the insulating layer 200 respectively; and bonding the first metal layer 100 with one side of the insulating layer 200 and the second metal layer 300 with the other side of the insulating layer 200 by thermocompression so as to obtain the double-sided metal laminate.

Various examples of the metal laminate of the present invention and respective physical or chemical properties measured will now be described.

Example 6

The polyamic acid solution (the precursor of the polyimide resin) of Example 1 was coated on a copper foil metal layer (with a thickness of 18 μm). The metal layer was heated at 130° C. for 10 minutes first, and then heated at 380° C. for another 10 minutes to induce the imidization reaction so as to obtain a single-sided metal laminate (the $1^{st}$ metal laminate). The above process was repeated to obtain another single-sided metal laminate (the $2^{nd}$ metal laminate). The insulating layer of the $1^{st}$ metal laminate and the insulating layer of the $2^{nd}$ metal laminate were disposed opposite to each other, and then bonded by thermocompression. The resultant double-sided metal laminate has only one polyimide insulating layer between the metal layers (the manufacturing method (2)).

Example 7

The polyamide acid solution (the precursor of the polyimide resin) of Example 1 was coated on a copper foil metal layer (with a thickness of 18 μm). The metal layer was heated at 130° C. for 10 minutes first, and then heated at 380° C. for another 10 minutes to induce the imidization reaction. The product is a single-sided metal laminate. Another metal layer was disposed opposite to the insulating layer of the metal laminate, and then the insulating layer and the metal layer were bonded by thermocompression. The resultant double-sided metal laminate has only one polyimide insulating layer between the metal layers (the manufacturing method (1)).

Example 8

The polyamide acid solution (the precursor of the polyimide resin) of Example 1 was coated on a detachable carrier. The carrier was heated at 130° C. for 10 minutes first, and then heated at 380° C. for another 10 minutes to induce the imidization reaction, thereby forming the polyimide resin. The resin was peeled to obtain a polyimide film. The metal layers were disposed on both sides of the film, and then the polyimide film and the metal layers were bonded by thermocompression.

The resultant double-sided metal laminate has only one polyimide insulating layer between the metal layers (the manufacturing method (3)).

Example 9

The polyamide acid solution (the precursor of the polyimide resin) of Example 2 was coated on a copper foil metal layer (with a thickness of 18 μm). The metal layer was heated at 130° C. for 10 minutes first, and then heated at 380° C. for another 10 minutes to induce the imidization reaction. The product is a single-sided metal laminate (the $1^{st}$ metal laminate). The above process was repeated to obtain another single-sided metal laminate (the $2^{nd}$ metal laminate). The insulating layer of the $1^{st}$ metal laminate and the insulating layer of the $2^{nd}$ metal laminate were disposed opposite to each other, and then bonded by thermocompression. The resultant double-sided metal laminate has only one polyimide insulating layer between the metal layers (the manufacturing method (2)).

Example 10

The polyamide acid solution (the precursor of the polyimide resin) of Example 2 was coated on a copper foil metal layer (with a thickness of 18 μm). The metal layer was heated at 130° C. for 10 minutes first, and then heated at 380° C. for another 10 minutes to induce the imidization reaction. The product is a single-sided metal laminate. Another metal layer was disposed opposite to the insulating layer of the metal laminate, and then the insulating layer and the metal layer were bonded by thermocompression. The resultant double-sided metal laminate has only one polyimide insulating layer between the two metal layers (the manufacturing method (1)).

Comparative Example 4

The polyamide acid solution (the precursor of the polyimide resin) of Comparative Example 3 (a conventional thermoplastic polyimide, TPI) was coated on a copper foil metal layer (with a thickness of 18 μm). The metal layer was heated at 130° C. for 10 minutes first, and then heated at 380° C. for another 10 minutes to induce the imidization reaction. The product is a single-sided metal laminate (the $1^{st}$ metal laminate). The above process was repeated to obtain another single-sided metal laminate (the $2^{nd}$ metal laminate). The insulating layer of the $1^{st}$ metal laminate and the insulating layer of the $2^{nd}$ metal laminate were disposed opposite to each other, and then bonded by thermocompression. The resultant double-sided metal laminate has only one polyimide insulating layer between the metal layers (the manufacturing method (2)).

Comparative Example 5

The polyamide acid solution (the precursor of the polyimide resin) of Comparative Example 3 (a conventional thermoplastic polyimide, TPI) was coated on a copper foil metal layer (with a thickness of 18 μm). The metal layer was heated at 130° C. for 10 minutes first, and then heated at 380° C. for another 10 minutes to induce the imidization reaction. The product is a single-sided metal laminate. Another metal layer was disposed opposite to the insulating layer of the metal laminate, and then the insulating layer and the metal layer were bonded by thermocompression. The double-sided metal laminates of Comparative Examples 5 and 4 are different in the manufacturing methods. The metal laminate of Comparative Example 5 is made by the manufacturing method (1).

Comparative Example 6

Comparative Example 6 relates to a conventional polyimide laminate including an adhesive. A commercial thermoplastic polyimide composite film (e.g., Kaneka FRS film) has a three-layer structure TPI-PI-TPI, and a thickness of about 25 µm. The TPI (i.e. thermoplastic polyimide film of Comparative Example 3) is an adhesive bonding the inner PI layer to the outer metal layer. Two copper foil metal layers were disposed on both sides of the Kaneka FRS film, and then the two copper metal layers and the Kaneka FRS film were bonded by thermocompression to obtain a double-sided metal laminate (the manufacturing method (3)).

Comparative Example 7

Comparative Example 7 relates to a laminate using a liquid crystal polymer (LCP) film as an insulating layer. The LCP has a molecular structure of an aromatic polyester polymer, which is different from that of the polyimide of the present invention. Comparative Example 7 uses a commercial LCP film (Kuraray LCP Film VECSTAR) as an insulating layer. Two copper foil metal layers were disposed on both sides of the LCP film, and then the two copper foil metal layers and the LCP film were bonded by thermocompression to obtain a double-sided metal laminate (the manufacturing method (3)).

After the metal laminates of Examples and Comparative Examples had been manufactured, their respective dielectric constants (Dk), dissipation factors (Df), coefficients of thermal expansion (CTE), peel strengths and dimension stability were measured. The results of the measurement are shown in Table 3. The methods for measuring Dk, Df and CTE are the same as those used in Examples 1-5. The peel strengths were measured according to IPC-TM-650-2.4.9 test method, and the dimensional stability was measured according to IPC-TM-650-2.4.4C test method.

TABLE 3

Properties of Metal laminates

|  | Dk | Df | CTE | Peel-strength | Dimensional stability |
|---|---|---|---|---|---|
| Example 6 | 3.18 | 0.005 | 26 | 0.92 | 0.07% |
| Example 7 | 3.18 | 0.005 | 27 | 0.88 | 0.09% |
| Example 8 | 3.19 | 0.005 | 27 | 0.89 | 0.08% |
| Example 9 | 3.18 | 0.005 | 26 | 0.92 | 0.08% |
| Example 10 | 3.18 | 0.005 | 27 | 0.88 | 0.09% |
| Comparative Example 4 | 3.10 | 0.008 | 55 | 1.03 | −0.25% |
| Comparative Example 5 | 3.09 | 0.009 | 56 | 0.98 | −0.19% |
| Comparative Example 6 | 3.42 | 0.014 | 24 | 1.16 | 0.08% |
| Comparative Example 7 | 3.28 | 0.003 | 48 | 0.64 | −0.12% |

The Comparative Examples 4 and 5 in Table 3 show that the metal laminates with a thermoplastic polyimide (TPI) insulating layer have higher CTE and lower dimensional stability than those of Examples 1-5. Thus, the TPI is only suitable for serving as an adhesive, rather than as an insulating layer. The metal laminate of the present invention employs a single polyimide resin layer to have the thermocompression property of TPI and the dimensional stability of PI, and to meet the requirements of a high-frequency material.

Besides, the double-sided metal laminates of Example 8, Comparative Example 6 and Comparative Example 7 were manufactured by the same method (the manufacturing method (3)) and their properties were compared. Table 3 shows that the metal laminate with an adhesive (Comparative Example 6) has a low CTE, a satisfactory peel strength and a good dimensional stability, but its Df and Dk are high. The metal laminate of Comparative Example 7 (LCP film) has the lowest Df (good for the high frequency device), but its CTE is high, and its peel strength and dimensional stability are low. In contrast, the metal laminate of the present invention (Example 8) has moderate peel strength, Df and Dk, and thus is suitable for designing small-sized high-density and high frequency circuits.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A metal laminate comprising
a first metal layer; and
an insulating layer disposed on the metal layer and directly contacts the metal layer;
wherein the insulating layer is made of a polyimide resin, and the polyimide resin is derived from at least two dianhydride monomers and at least two diamine monomers,
wherein the dianhydride monomers are selected from the group consisting of p-phenylenebis(trimellitate anhydride), 4,4'-(hexafluoroisopropylidene)-diphthalic anhydride, 4,4'-(4,4'-isopropylidenediphenoxy)bis (phthalic anhydride) and the combination thereof; one of the diamine monomers is 2,2'-bis(trifluoromethyl) benzidine, and the other diamine monomers are selected from a group consisting of 2,2-bis[4-(4-aminophenoxy)phenyl, 1,3-bis(4-aminophenoxy)benzene, p-phenylenediamine, 4,4'-oxydianiline, 4,4'-methylenedianiline, 4,4'-diaminobenzanilide, 4,4'-diaminodiphenyl-sulfone, m-tolidine, 2,2-bis[4-(4-aminophenoxy)phenyl]hexafluoropropane and the combination thereof,
wherein a molar ratio of the dianhydride monomers to the diamine monomers is between 0.85 and 1.15;
wherein a dissipation factor of the insulating layer is below 0.007, and the coefficient of thermal expansion of the insulating layer is between 15 and 35 ppm/K.
2. The metal laminate of claim 1, wherein the 2,2'-bis (trifluoromethyl)benzidine having an amount of moles accounting for 70 to 90% of total moles of the diamine monomers.
3. The metal laminate of claim 1 further comprises:
a second metal layer disposed on the insulating layer, wherein the first metal layer and the second layer are separated exclusively by the insulating layer.

4. The metal laminate of claim 3, wherein the first metal layer and the second metal layer are made of the same material.

5. The metal laminate of claim 3, wherein the first metal layer and the second metal layer are made of different materials.

6. The metal laminate of claim 1, wherein a thickness of the insulating layer is between 5 to 50 μm.

7. The metal laminate of claim 1, wherein a structure of the other diamine monomers are non-linear.

8. A method for manufacturing a metal laminate, comprises the following steps:
providing a first metal layer;
coating a precursor of a polyimide resin on the first metal layer, wherein the precursor of the polyimide resin is polymerized by at least two dianhydride monomers and at least two diamine monomers; the dianhydride monomers are selected from the group consisting of p-phenylenebis(trimellitate anhydride), 4,4'-(hexafluoroisopropylidene)-diphthalic anhydride, 4,4'-(4,4'-isopropylidenediphenoxy)bis(phthalic anhydride) and the combination thereof; one of the diamine monomers is 2,2'-bis(trifluoromethyl)benzidine, and the other diamine monomers are selected from a group consisting of 2,2-bis[4-(4-aminophenoxy)phenyl, 1,3-bis(4-aminophenoxy)benzene, p-phenylenediamine, 4,4'-oxydianiline, 4,4'-methylenedianiline, 4,4'-diaminobenzanilide, 4,4'-diaminodiphenyl-sulfone, m-tolidine, 2,2-bis[4-(4-aminophenoxy)phenyl] hexafluoropropane and the combination thereof; wherein a molar ratio of the dianhydride monomers to the diamine monomers is between 0.85 and 1.15; and
imidizing the precursor of the polyimide resin to form a first polyimide layer;
wherein a dissipation factor of the first polyimide layer is below 0.007, and the coefficient of thermal expansion of the insulating layer is between 15 and 35 ppm/K.

9. The method of claim 8, wherein 2,2'-bis(trifluoromethyl)benzidine has an amount of moles accounting for 70 to 90% of total moles of the diamine monomers.

10. The method of claim 8, further comprises:
providing a second metal layer disposed on the opposite side of the first polyimide layer; and
bonding the first polyimide layer and the second metal layer by thermocompression.

11. The method of claim 8, further comprises:
providing a second metal layer;
coating the precursor of the polyimide resin on the second metal layer;
imidizing the precursor of the polyimide resin on the second metal layer to form a second polyimide layer; and
disposing the first polyimide layer on the opposite side of the second polyimide layer, and bonding the first polyimide layer and the second polyimide layer by thermocompression.

12. A method for manufacturing a metal laminate, comprises the following steps:
providing a polyimide film, wherein the polyimide film is derived from at least two dianhydride monomers and at least two diamine monomers; wherein the dianhydride monomers are selected from the group consisting of p-phenylenebis(trimellitate anhydride), 4,4'-(hexafluoroisopropylidene)-diphthalic anhydride, 4,4'-(4,4'-isopropylidenediphenoxy)bis(phthalic anhydride) and the combination thereof; one of the diamine monomers is 2,2'-bis(trifluoromethyl)benzidine, and the other diamine monomers are selected from a group consisting of 2,2-bis[4-(4-aminophenoxy)phenyl, 1,3-bis(4-aminophenoxy)benzene, p-phenylenediamine, 4,4'-oxydianiline, 4,4'-methylenedianiline, 4,4'-diaminobenzanilide, 4,4'-diaminodiphenyl-sulfone, m-tolidine, 2,2-bis[4-(4-aminophenoxy)phenyl] hexafluoropropane and the combination thereof; wherein a molar ratio of the dianhydride monomers to the diamine monomers is between 0.85 and 1.15;
disposing a first metal layer on one side of the polyimide film and a second metal layer on the other side of the polyimide film; and
bonding the first and the second metal layer and the polyimide film by thermocompression;
wherein a dissipation factor of the polyimide film is below 0.007, and the coefficient of thermal expansion of the insulating layer is between 15 and 35 ppm/K.

* * * * *